United States Patent Office 3,482,976

Patented Dec. 9, 1969

3,482,976

PHOTOLYTIC ETCHING OF GOLD

Donald L. Schaefer and James F. Burgess, Schenectady, N.Y., assignors to General Electric Company, a corporation of New York No Drawing. Filed Dec. 27, 1966, Ser. No. 604,541
Int. Cl. G03f 7/10; G03c 5/00
U.S. Cl. 96—36 7 Claims

ABSTRACT OF THE DISCLOSURE

A process is disclosed whereby gold surfaces and particularly thin supported gold films may be selectively etched by exposing an interface between the gold surface and an overlying photodecomposable reagent to activating radiation which produces chemically reactive species which in the presence of alcohol attacks and preferentially etches the gold film.

This invention relates to the etching of metallic gold in response to the impingement of activating radiation on the surface thereof and, more particularly, to the provision of a method for the etching of metallic gold at a common interface between the gold surface and an overlying reagent comprising a photodecomposable substance which when exposed to activating radiation decomposes to form chemically reactive species which react with and etch the gold at the interface in the illuminated zones. It should be noted that this point that the photoetching of gold was previously unsuccessfully attempted by the process disclosed in copending application Ser. No. 275,753, Gaynor, filed Apr. 25, 1963, now Patent No. 3,346,384, granted Oct. 10, 1967 entitled "Metal Image Formation" and a different process for photoetching of gold disclosed and claimed in application Ser. No. 604,601, filed in the name of Schaefer concurrently herewith, both applications being assigned to the assignee of the present invention.

BACKGROUND OF THE INVENTION

The use of gold films for the electrically conductive paths in so-called printed circuit elements, particularly for use in miniaturized circuits is known. Gold is a particularly useful material because of its chemical stability, its high electrical conductivity and the technology of the deposition of thin films of gold on various substrates by evaporation, electroplating or combinations of these techniques is well developed. However, in the prior art techniques, after a suitable substrate had been provided with a thin gold film, production of a circuit pattern therefrom required the use of a photoresist-etching technique to remove the unwanted areas of gold, leaving the desired pattern of conducting paths comprising the circuit. For example, this technique conventionally involves coating a film of gold uniformly over the surface of a suitable non-conductive substrate such as glass or an organic polymeric material, for example, by evaporation in a vacuum chamber. The film is overcoated with a conventional photoresist material which is then exposed to a pattern of activating radiation in the form of the circuit pattern to be produced. The photoresist material reacts to the radiation such that those areas or zones which were irradiated are converted to an insoluble material while those zones which were not illuminated remain soluble. The photoresist material is then washed in a solvent which removes the soluble portions of the photoresist film leaving behind the pattern of insoluble photoresist coating in the form of a mask over the gold film. The exposed portions of the gold film may then be removed by etching with a solvent for gold such as potassium cyanide or aqua regia, for example. Thereafter, the photoresist mask may be removed in part or entirely and the printed circuit element further processed. It will therefore be seen that this procedure has several inherent disadvantages. The photolytic reaction of the photoresist materials usually involves a polymerization or cross-linking type reaction and the edge resolution between reacted and unreacted zones is frequently of uncertain quality and may be difficult to consistently reproduce from element to element. Considerable care must be exercised during the washing step to prevent portions of the insoluble photoresist pattern from lifting, yet all of the soluble material must be removed. Undercutting of the insoluble pattern by the etchant is unavoidable and virtually impossible to accurately control which introduces variations in the electrical characteristics of each element for which external compensation may be necessary. The only way in which the conductivity or resistivity of a given current carrying path may be adjusted is by varying the width of the path since the thickness of the film is constant. Furthermore, great care must be exercised in removing the insoluble photoresist pattern to avoid damage to the gold film circuit. It would be advantageous to eliminate the necessity for the use of the photoresist material and the multiple step process attendant therewith and the use of these hazardous materials.

It is therefore a principal object of this invention to provide a process for etching predetermined patterns in gold surfaces which does not require the application of a mask to the surface of the film.

A further object of this invention is the provision of a method for the selective etching of a gold surface at controllably different rates in different zones thereof simultaneously.

Other and specifically different objects of this invention will become apparent to those skilled in the art from the following disclosure.

SUMMARY OF THE INVENTION

Briefly stated, this invention provides a method for the selective etching of gold surfaces and particularly of supported thin gold films by providing a common interface between the gold surface and an overlying vehicle which carries or contains a photodecomposable material which is nominally inert with respect to gold, exposing said interface to a pattern of activating radiation whereby said material is photolytically decomposed to form species which are chemically reactive with gold in the presence of an alcohol with which it may form a complex, to form soluble gold complexes or compounds whereupon a pattern is etched in the gold surface which has a point-to-point correspondence to the pattern of activating radiation and at a rate which is dependent at least in part upon the intensity of the radiation at any given point on the interface. It shoud be noted that the vehicle may be in either a liquid or solid condition.

DESCRIPTION OF THE PREFERRED EMBODIMENTS

More particularly, the following specific working examples demonstrate the invention in greater detail.

EXAMPLE 1

A solution of about 0.1 molar iodoform in methanol was prepared. A strip of polyethylene terephthalate resin tape having a film of gold about 200 A. in thickness on one surface was placed in a quartz vial and the vial filled with the solution. The vial was exposed to a radiation pattern from a high pressure 150 watt xenon lamp for about 15 minutes at which time the gold film was completely etched to the substrate in the zones of illumination.

EXAMPLE 2

The procedure set forth in Example 1 was repeated but ethanol was substituted for methanol. The etching rate was slightly slower than with methanol.

EXAMPLE 3

The procedure set forth in Example 1 was repeated but N-bromosuccinimide, carbon tetrabromide, N,N'-dibromodimethyl hydantoin, pentabromoethane, 3 bromobenzonitrile,, ethylene dibromide, m-bis(1,2-dibromoethyl) benzene, N-chlorosuccinimide, tetraiodopyrole, 2 tribromoethylquinoxaline, N,N-dichlorobenzene sulfonamide, N-chlorophtalimide, and trichloromethane sulfonyl chloride were each substituted for the iodoform and produced comparable results.

EXAMPLE 4

The procedure set forth in Example 2 was repeated but N-bromosuccinimide was substituted for the iodoform. Satisfactory etching was observed.

EXAMPLE 5

A glass slide having an evaporated gold film about 1000 A. thick on the surface was provided with a solid film overcoating for the gold film by casting a solution of 0.2 gram of N,N-dibromodimethyl hydantoin in 5.0 cc. of "Carboset No. 525" (an acrylic resin soluble in alkaline water and a number of solvents made by B. F. Goodrich Chemical Company) in methanol. The film was dried in an oven at 85° C. for 10 minutes and was about 48 microns thick. The resin coated slide was then exposed to a pattern of light and dark zones in a 500 watt tungsten filament projector for one-half hour. The gold film was removed to the glass substrate in the illuminated zones but was unaffected in the dark zones.

EXAMPLE 6

A slide was prepared as set forth in Example 5 except that the film was formed from 0.5 gram N,N-dibromodimethyl hydantoin in 5.0 cc. of 10 percent of ABS (an alcohol soluble butyrate manufactured by Eastman Chemical Products, Inc.) in methanol with 1.0 cc. acetone. After oven drying the film was found to be about 12 microns thick. The slide was exposed to methanol vapor for one minute by placing it, film side up, upon a paper towel saturated with methanol and covered with a watch glass. The slide was then exposed for two minutes in the previously described projector and the gold film was found to be removed in the illuminated areas and unaffected in the dark areas.

EXAMPLE 7

The procedure recited in Example 6 was repeated except that it was not exposed to methanol vapor prior to exposure to the light pattern. After irradiation, there was no visible evidence that the gold film had been attacked. The slide was then exposed to methanol vapor for one minute and the etched pattern developed as in Example 6.

A number of resins and etching reagents have been used to successfully etch such gold films. For example, polymers such as RJ–100 (a hydroxylated polymeric resin manufactured by Monsanto Chemical Corporation), polyvinyl chloride, AN Gantrez 139 (a copolymer of methyl vinyl ether and maleic anhydride manufactured by General Analine and Film Company), and polysulfone P1700 (manufactured by Union Carbide Corporation) were used in combination with N-bromosuccinimide, N-chlorosuccinimide, and dichloroamine T in addition to the polymers and reagents listed in Examples 5, 6, and 7. Furthermore, when polymer films were formed from polystyrene-benzene solutions containing iodoform or N,N'-dibromodimethylhydantoin as the reactive ingredient, no etching was observed upon illumination, but when the film was exposed to methanol vapor either before illumination or after, successful etching was accomplished, even though polystyrene is not considered to be soluble in methanol. Ethanol vapor produces similar effects as does mixtures of ethanol and methanol vapors.

It has been found that the halogen containing photosensitive reagents are those containing chlorine, bromine or iodine atoms having a bond dissociation energy of less than about 100 kilocalories per mole. For example, iodoform has a bond dissociation energy of 44 Kcal. per mole and N-bromosuccinimide 46 Kcal. per mole. It has further been found that in general where the dissociatable halogen is bonded to a carbon atom, the carbon atom should be part of an aliphatic structure or an aliphatic substituent of an aromatic structure. Compounds having the halogen bonded to an aromatic ring structure carbon are not as efficient or do not etch at all. In the case of the succinimides, the halogen and nitrogen are joined by a covalent bond and hence are distinguishable. In the liquid alcohol-halogen systems, the solutions were found to be strongly acidic after irradiation. In the case of the polymeric films, the ability to activate the etching ingredients by exposure to alcohol vapor after the illumination step permits the use of hard films and contact printing techniques.

From all the foregoing, it will be apparent to those skilled in the art that variations of the specific etching techniques may be readily accomplished within the scope of the invention. Therefore the invention should not be limited except as defined by the following claims.

What we claim as new and desire to secure by Letters Patent of the United States is:

1. The method of photoetching gold comprising the steps of providing a metallic gold surface with an overlayer containing a halogenated organic compound which is photodecomposable to form chemically reactive species which combine with gold in the presence of an alcohol selected from the group consisting of methanol and ethanol to form soluble gold products, said photodecomposable halogenated organic compound providing a source of halogen selected from the group consisting of chlorine, bromine and iodine and having a halogen bond dissociation energy of less than about 100 kilocalories per mole; and exposing said overlayer to activating radiation in the presence of said alcohol to form the soluble gold product.

2. The method recited in claim 1 wherein said organic material is a liquid solution of said halogenated organic compound in said alcohol.

3. The method recited in claim 1 wherein said photodecomposable halogenated organic compound is selected from the group consisting of iodoform, N-bromosuccinimide, carbon tetrabromide, N,N' dibromodimethylhydantoin, pentabromomethane, 3 bromobenzonitide, ethylene dibromide, m-bis (1,2 dibromoethyl) benzene, N-chlorosuccinimide, tetraiodopyrole, 2 tribromoethyl-quinoxaline, N,N'-dichlorobenzene sulfonamide, N-chlorophthalimide and trichloromethane sulfonyl chloride.

4. The method recited in claim 1 wherein said overlayer comprises a solid film of an organic polymeric resin.

5. The method recited in claim 4 wherein said alcohol is provided by exposing said solid film to alcohol vapor prior to exposing said overlayer to activating radiation.

6. The method recited in claim 4 wherein said alcohol is provided by exposing said solid film to the vapor of said alcohol after exposing said overlayer to activating radiation.

7. The method recited in claim 3 wherein said overlayer comprises a solid film of an organic polymeric resin.

References Cited

UNITED STATES PATENTS 3,346,384 10/1967 Gaynor -------------- 96—35.2

GEORGE F. LESMES, Primary Examiner

J. P. BRAMMER, Assistant Examiner

U.S. Cl. X.R.

96—36.2